(12) United States Patent
Geusic et al.

(10) Patent No.: US 6,242,304 B1
(45) Date of Patent: *Jun. 5, 2001

(54) METHOD AND STRUCTURE FOR TEXTURED SURFACES IN FLOATING GATE TUNNELING OXIDE DEVICES

(75) Inventors: Joseph E. Geusic, Berkeley Heights, NJ (US); Leonard Forbes, Corvallis, OR (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,539

(22) Filed: May 29, 1998

(51) Int. Cl.[7] .................................................. H01L 21/336
(52) U.S. Cl. .......................................... 438/260; 438/264
(58) Field of Search .................................... 438/260, 197, 438/264, 594, 665; 365/185, 182, 104, 179, 187; 257/321, 314

(56) References Cited

U.S. PATENT DOCUMENTS

| | | | |
|---|---|---|---|
| 4,203,158 | * 5/1980 | Frohman-Bentchkowsky et al. | 365/185.29 |
| 4,274,012 | * 6/1981 | Simko | 365/185.14 |
| 4,599,706 | * 7/1986 | Guterman | 365/185.08 |
| 4,706,102 | * 11/1987 | Pan et al. | 365/185.06 |
| 4,757,360 | 7/1988 | Faraone et al. | 357/23.5 |
| 4,807,003 | * 2/1989 | Mohammadi et al. | 365/187 |
| 4,947,221 | * 8/1990 | Stewart et al. | 257/316 |
| 5,020,030 | * 5/1991 | Huber | 365/185 |
| 5,087,583 | * 2/1992 | Hazani | 438/260 |
| 5,089,867 | * 2/1992 | Lee | 257/316 |
| 5,229,631 | * 7/1993 | Woo | 257/314 |
| 5,241,496 | 8/1993 | Lowrey et al. | 365/96 |
| 5,416,738 | * 5/1995 | Shrivastava | 365/185.24 |
| 5,429,966 | * 7/1995 | Wu et al. | 438/594 |
| 5,445,982 | * 8/1995 | Hwang | 438/591 |
| 5,467,306 | 11/1995 | Kaya et al. | 365/185.2 |
| 5,544,103 | * 8/1996 | Lambertson | 365/185.15 |
| 5,546,340 | * 8/1996 | Hu et al. | 365/185.03 |
| 5,581,502 | * 12/1996 | Richart et al. | 365/185.02 |
| 6,025,627 | * 2/2000 | Forbes et al. | 257/321 |

FOREIGN PATENT DOCUMENTS

408148584 * 6/1996 (JP) ........................... H01L/21/8247

OTHER PUBLICATIONS

J. Geusic and L. Forbes, "Structured Silicon Surfaces and Tunnel Oxides for Flash Memory Devices".*

(List continued on next page.)

*Primary Examiner*—Olik Chaudhuri
*Assistant Examiner*—Theresa Doan
(74) *Attorney, Agent, or Firm*—Schwegman, Lundberg, Woessner & Kluth, P.A.

(57) ABSTRACT

A method and structure for textured surfaces in non volatile floating gate tunneling oxide (FLOTOX) devices, e.g. FLOTOX transistors, are provided. The present invention capitalizes on using "self-structured masks" and a controlled etch to form nanometer scale microtip arrays in the textured surfaces. The microtips in the array of microtips have a more uniform size and shape and higher density ($\sim 10^{12}/cm^2$) at the substrate/tunnel oxide ($Si/SiO_2$) interface than in current generation FLOTOX transistors. This higher density is four orders of magnitude greater than that which has been in use with FLOTOX transistor technology. In result, the new method and structure produce significantly larger tunneling currents for a given voltage than attained in prior work. The new method and structure are advantageously suited for the much higher density, non volatile FLOTOX transistors desired for use in flash memories and in electronically erasable and programmable read only memories (EEPROMs). These FLOTOX transistors are candidates for replacing the low power operation transistors found in DRAMs.

21 Claims, 6 Drawing Sheets

OTHER PUBLICATIONS

T. Tada, A. Hamoudi, and T. Kanayama, "Spontaneous production of 10–nm Si structures by plasma etching of self–formed masks", Appl. Phys. Lett. 70 (19) 1997, 2538, May 12, 1997.*

Fong, Y., et al., "Oxides Grown on Textured Single–Crystal Silicon—Dependence on Process and Application in EEPROMs", *IEEE Transactions on Electron Devices,* 37, 583–590, (Mar. 1990).

Hao, M.Y., et al., "Electrical Characteristics of Oxynitrides Grown on Textured Single–Crystal Silicon", *Appl. Phys. Lett.,* 60, 445–447, (Jan. 1992).

Tachi, S., et al., "Low–Temperature Reactive Ion Etching and Microwave Plasma Etching of Silicon", *Applied Physics Letters,* 52, 616–18, (Feb. 22, 1988).

Tada, T., et al., "Spontaneous Production of 10–nm Si Structures by Plasma Etching Using Self–formed Masks", *Applied Physics Letters,* 70, 2538–40, (May 12, 1997).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

* cited by examiner

METHOD AND STRUCTURE FOR TEXTURED SURFACES IN FLOATING GATE TUNNELING OXIDE DEVICES

FIELD OF THE INVENTION

The present invention relates generally to semiconductor integrated circuits. More particularly, it pertains to a method and structure for textured surfaces in floating gate tunneling oxide devices.

BACKGROUND OF THE INVENTION

Modern integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. Today, also, low voltages are desired for low power, portable, battery operated circuits and systems. Thus, it is desirable to construct integrated circuit components which can operate at low voltage levels and accommodate higher density arrangement on the surface of the silicon chip.

Non volatile floating gate tunneling oxide (FLOTOX) devices, e.g. FLOTOX transistors, offer the prospect of very high density structures. Flash memories are one form of FLOTOX devices and electronically erasable and programmable read only memories (EEPROMs) are another. Due to their high density nature, memories formed with FLOTOX transistors have the potential of replacing hard storage disk drives in computer systems. The advantages to this substitution would be in replacing a complex and delicate mechanical system with a rugged and easily portable small solid-state non-volatile memory system. There is also the possibility that given more speed of operation, particularly in the erase operation, that FLOTOX transistors might be used to replace dynamic random access memories (DRAMs). Thus, FLOTOX transistors might eventually have the ability to fill all memory needs in future computer systems.

In operation, FLOTOX transistors can be electrically programmed, erased, and reprogrammed. In FLOTOX transistors a floating gate is electrically isolated and any charge stored on the floating gate is trapped. Storing sufficient charge on the floating gate will create an inversion channel between source and drain of the transistor. Thus, the presence or absence of charge on the floating gate represents two distinct data states.

Typically, FLOTOX transistors are selectively programmed, or "written to," by hot electron injection which places a charge on a floating gate during a write. The FLOTOX transistors are selectively erased by Fowler-Nordheim tunneling which removes the a charge from the floating gate. During a write, a high programming voltage is placed on a control gate. This forces an inversion region to form in the body region. The drain voltage is increased to approximately half the control gate voltage while the source is grounded, increasing the voltage drop between the drain and source. In the presence of the inversion region, the current between the drain and source increases. The resulting high electron flow from source to drain increases the kinetic energy of the electrons. This causes the electrons to gain enough energy to overcome the outside barrier and collect on the floating gate.

After the write is completed, the negative charge on the floating gate raises the transistor's threshold voltage ($V_T$) above the wordline logic 1 voltage. When a written transistor's wordline is brought to a logic 1 during a read, the transistor will not turn on. Sense amplifiers detect and amplify the transistor current, and output a 0 for a written transistor.

The floating gate can be unprogrammed, or "erased," by grounding the control gate, leaving the drain unconnected, and raising the source voltage to a sufficiently high positive voltage to transfer electrons out of the floating gate to the source terminal of the transistor by tunneling through the insulating gate oxide. After the erase is completed, the lack of charge on the floating gate lowers the cell's $V_T$ below the wordline logic 1 voltage. Thus when an erased cell's wordline is brought to a logic 1 during a read, the transistor will turn on and conduct more current than a written cell. Some flash devices use Fowler-Nordheim tunneling for write as well as erase.

One of the present hurdles to FLOTOX transistors replacing DRAMs concerns the Fowler-Nordheim (FN) erase operation. Fowler-Nordheim tunneling requires high voltages, is relatively slow, and introduces erratic over erase and other reliability problems due to the very high erase voltages used. These very high erase voltages are a fundamental problem arising from the high electron affinity of bulk silicon or large grain polysilicon particles used as the floating gate. The high electron affinity creates a very high tunneling barrier and, even with high negative voltages applied to the gate, a large tunneling distance. The high tunneling barrier and large tunneling distance equate to a very low tunneling probability for electrons attempting to leave the floating gate. This results in long write times since the net flux of electrons leaving the floating gate is low or the tunneling current discharging from the floating gate is low.

One method for FLOTOX transistors to overcome the high erase voltages and attain DRAM level operation voltages is through the use of textured or micro-roughened surfaces. Efforts have demonstrated that producing a textured surface at the substrate/tunnel oxide (Si/SiO$_2$) interface increases the electric fields between the floating gate and the substrate. The higher electric field in turn produces higher tunneling currents at lower voltages. Previous work has achieved a textured surface of microtips where the average density of the microtips was found to be approximately $10^8$/cm$^2$. Such results produce FLOTOX transistors with suitable rapid, low (DRAM level) operation voltages for transistor cell sizes where the Si/SiO$_2$ interface has an area significantly greater than 10 square micrometers (m$^2$). Below 10 square microns, however, the large statistical variation of microtip number from transistor to transistor causes an unacceptable variability of tunneling current between transistors for a fixed voltage. Presently, most high density transistors are fabricated in an area of less than 10 $\mu$m$^2$.

Thus, what is needed are fast, low power FLOTOX transistors with dimensions that accord with the industry's demand for high density devices. Low power must be maintained in order to accommodate portable and battery operated devices. In effect, FLOTOX transistors are needed which possess high tunneling current values at low voltages in a chip surface area of less than 10 $\mu$m$^2$.

For the reasons stated above, and for other reasons stated below which will become apparent to those skilled in the art upon reading and understanding the present specification, it is desirable to develop an improved method and structure for FLOTOX transistors.

SUMMARY OF THE INVENTION

The above mentioned problems with tunneling oxide devices and other problems are addressed by the present invention and will be understood by reading and studying the following specification. A method and structure are provided to increase tunneling currents at lower voltages in FLOTOX transistors.

In particular, an illustrative embodiment of the present invention includes a non volatile memory cell structure. The non volatile memory cell structure includes a substrate. The substrate has a textured surface which includes an array of microtips. Each microtip has a top surface. The microtips in the array of microtips are uniform and have an average density of $10^{12}/cm^2$. A tunnel oxide layer is formed on the substrate. A first gate is formed on the tunnel dielectric. An insulator layer is formed on the first gate. And, a second gate is formed on the insulator layer.

In another embodiment, a transistor is provided. The structure includes a first interface having spaced source and drain regions and a body region located between the source and drain regions on a first portion of the interface. The first interface has a micro-roughened surface on the first portion of the interface. The micro-roughened surface includes an array of asperities, each asperity has a top surface. The asperities in the array of asperities have an average density of $10^2/cm^2$. A second interface is adjacent to the first interface. There is a third interface adjacent to the second interface. And, a fourth interface is adjacent to the third interface.

In another embodiment, a memory array of non volatile memory cell structures is provided. The memory array includes a number of floating gate tunneling oxide (FLOTOX) transistors. Each FLOTOX transistor includes a substrate that has a first source/drain region, a second source/drain region, and a body region. The substrate has a textured surface. The textured surface includes an array of microtips with each microtip having a top surface. The microtips in the array of microtips have an average density of $10^{12}/cm^2$. A tunnel oxide layer is formed on the textured surface. A first conductive layer is formed on the tunnel oxide layer. An insulator layer is formed on the first conductive layer. There is additionally a second conductive layer formed on the insulator layer. A number of wordlines are included. Each wordline is coupled to the second conductive layer for a number of FLOTOX transistors. A number of bitlines are provided. Each bitline is coupled to the second source/drain region for a number of FLOTOX transistors. A number of sense amplifiers couple to a select number of the number of bitlines. Also, a number of sourcelines are present and each sourceline is coupled to a first source/drain region for a number of FLOTOX transistors.

In another embodiment, an information handling system is provided. The information handling system includes a memory array and a central processing unit (CPU) which are coupled by a system bus. The memory array includes the memory array described above and includes a number of floating gate tunneling oxide (FLOTOX) transistors, likewise described above.

Another embodiment for the present invention includes a method for fabricating a non volatile memory cell structure. The method includes forming a textured surface on a substrate. Forming the textured surface includes forming an array of microtips. Each microtip is formed to have a top surface. And, the microtips in the array of microtips are formed to have an average density of $10^2/cm^2$. A tunnel oxide layer is formed on the textured surface of the substrate. A first gate is formed on the tunnel oxide layer. An insulator layer is formed on the first gate. The method further includes forming a second gate on the insulator layer.

According to another embodiment, a method for fabricating a transistor is provided. The method includes forming a first interface. The first interface is formed with spaced source and drain regions and a body region located between the source and drain on a first portion of the interface. A micro-roughened surface is formed on the first portion of the interface. Forming the micro-roughened surface includes forming an array of asperities. Each asperity is formed with a top surface. Further, the method includes forming the asperities in the array of asperities with an average density of $10^{12}/cm^2$. A second interface is formed adjacent to the first interface. A third interface is formed adjacent to the second interface. And, the method further includes forming a fourth interface adjacent to the third interface.

Thus, an improved structure and method for textured surfaces in floating gate tunneling oxide (FLOTOX) devices are provided. The present invention capitalizes on using "self-structured masks" and a controlled etch to form nanometer scale microtip arrays in the textured surfaces. The microtips in the array of microtips have a more uniform size and shape and higher density ($\sim 10^{12}$ /$cm^2$) at the substrate/ tunnel oxide ($Si/SiO_2$) interface than is presently used in FLOTOX technology. This higher density is four orders of magnitude greater than that which had been previously achieved. In result, the new method and structure produce significantly larger tunneling currents for a given voltage than attained in prior work. The new method and structure are advantageously suited for the much higher density, non volatile FLOTOX transistors used in flash memories and in electronically erasable and programmable read only memories (EEPROMs). These FLOTOX transistors are candidates for replacing the low power operation transistors found in DRAMs.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
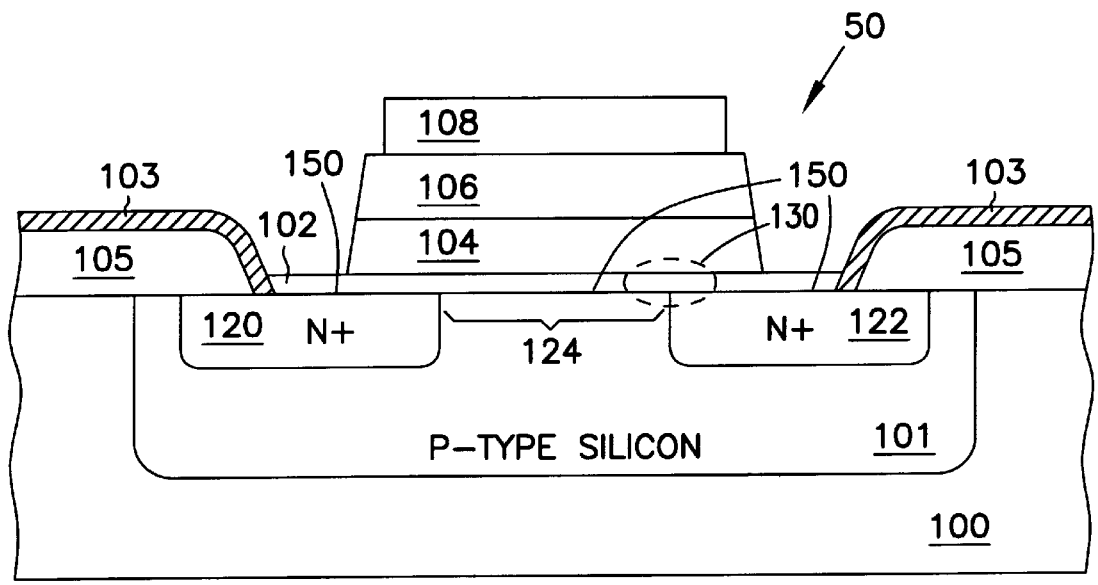
FIG. 1A is a cross-sectional view illustrating a non volatile floating gate tunneling oxide (FLOTOX) transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on", "upper," "side" (as in "sidewall"), "higher," "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

FIG. 1A is a cross-sectional view illustrating a non volatile floating gate tunneling oxide (FLOTOX) transistor 50 according to the teachings of the present invention. The FLOTOX transistor 50 is a non volatile memory cell structure which has a floating gate 104 that can be electrically programmed, erased, and reprogrammed. Flash memory is one form of non volatile memory which implements floating gates. Electronically erasable and programmable read only memories (EEPROMs) are another form. Both types are recognized by those of ordinary skill in the art. FIG. 1A illustrates that FLOTOX transistor 50 includes a body region 101 as part of a substrate 100. Substrate 100 includes bulk semiconductor starting material, semiconductor-on-insulator (SOI) starting material, or SOI material that is formed from a bulk semiconductor starting material during processing. Using bulk silicon processing techniques, the body region 101 is single crystalline silicon (Si) which has been doped with a p-type dopant to form an p-type body region. In an alternative embodiment, the body region 101 is single crystalline silicon (Si) which has been doped with an n-type dopant to form an n-type body region. The FLOTOX transistor 50 includes a first source/drain region 120 and a second source/drain region 122 which are formed in the body region 101 portion of the substrate 100. The first and second source/drain regions, 120 and 122 are formed of single crystalline silicon (Si) that has been doped with an n-type dopant to form n+first and second source/drain regions, 120 and 122. In an alternate embodiment, the first and second source/drain regions, 120 and 122, are formed of single crystalline silicon (Si) which has been doped with p-type dopant to form a p+first and second source/drain regions, 120 and 122. A channel region 124 is located in the body region 101 of the substrate 100 between the first and second source/drain regions, 120 and 122. The FLOTOX transistor 50 includes electrical contacts 103 which couple to the first and second source/drain regions, 120 and 122. Field oxide regions 105 define the boundary of the FLOTOX transistor 50 and serve to electrically isolate the FLOTOX transistor 50 from neighboring devices.

The FLOTOX transistor further includes a tunnel oxide layer 102 located on the substrate surface 150. The tunnel oxide layer 102 constitutes a first dielectric layer. The tunnel oxide layer is silicon dioxide ($SiO_2$) and covers the channel region 124 as well as portions of the first and second source/drain regions, 120 and 122 respectively. The location of the tunnel oxide layer 102 on the substrate surface 150 constitutes a first interface. A first gate 104 is located on the tunnel oxide layer 102. The first gate 104 is a first conductive layer and serves as the floating gate 104. In one embodiment, the first gate 104 is a polysilicon layer. The first gate 104 forms a second interface in combination with the tunnel oxide layer 102. An insulator layer 106 is positioned on top of the first gate 104. The insulator layer 106 constitutes a second dielectric layer. In one embodiment, the insulator layer 106 is a silicon dioxide ($SiO_2$) layer. The insulator layer 106 forms a third interface in combination with the first gate 104. A second gate 108 is further included in the FLOTOX transistor. The second gate 108 is a second conductive layer 108, which serves as a control gate 108. The second gate 108 is located on the insulator layer 106. The union between the second gate 108 and the insulator layer 106 forms a fourth interface. In one embodiment, the second gate 108 is a polysilicon layer.

Figure 1B:
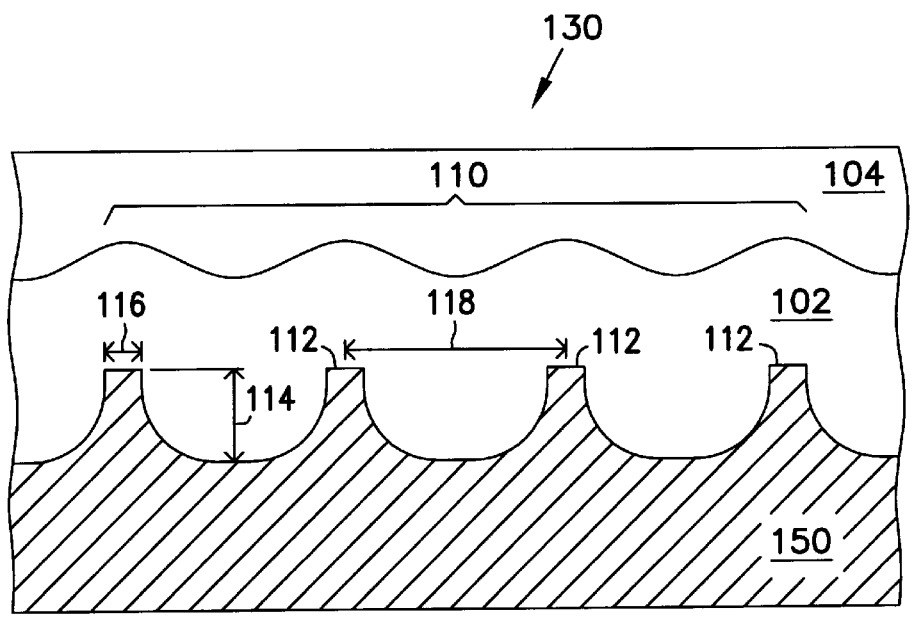
FIG. 1B is a cross-sectional view illustrating in greater detail an embodiment of an interface region for the FLOTOX transistor shown in FIG. 1A.

FIG. 1B is a cross-sectional view illustrating in greater detail an embodiment of an interface region 130 for the FLOTOX transistor shown in FIG. 1A. The interface region 130 depicted in FIG. 1B provides a sample representation of any region between the layered structure of the first gate 104, the tunnel oxide layer 102 and the substrate surface 150. FIG. 1B illustrates that the substrate surface 150 is textured. The substrate surface 150 includes an array of microtips 110. The array of microtips 110 consists of a multitude of asperities to the substrate surface 150. Each microtip has a top surface 112. In one embodiment, the microtips in array of microtips 110 have an average density of approximately $10^{12}$ microtips per square centimeter ($10^{12}/cm^2$) of substrate 100. In this embodiment, the microtips have an average height 114 of approximately 7 nanometers (nm). The top surfaces 112 of the microtips have an average diameter 116 of approximately 0.5 nm, and a center to center spacing 118 of the microtips which averages approximately 20 nm.

FIG. 1B's illustration of the interface region 130 further illustrates the tunnel oxide layer 102 covering the array of microtips 110. The tunnel oxide layer 102 on the array of microtips 110 provides a first interface. FIG. 1B further illustrates the first gate 104 located on the tunnel oxide layer 102. The junction between the first gate 104 and the tunnel oxide layer 102 provides a second interface.

Figure 2:
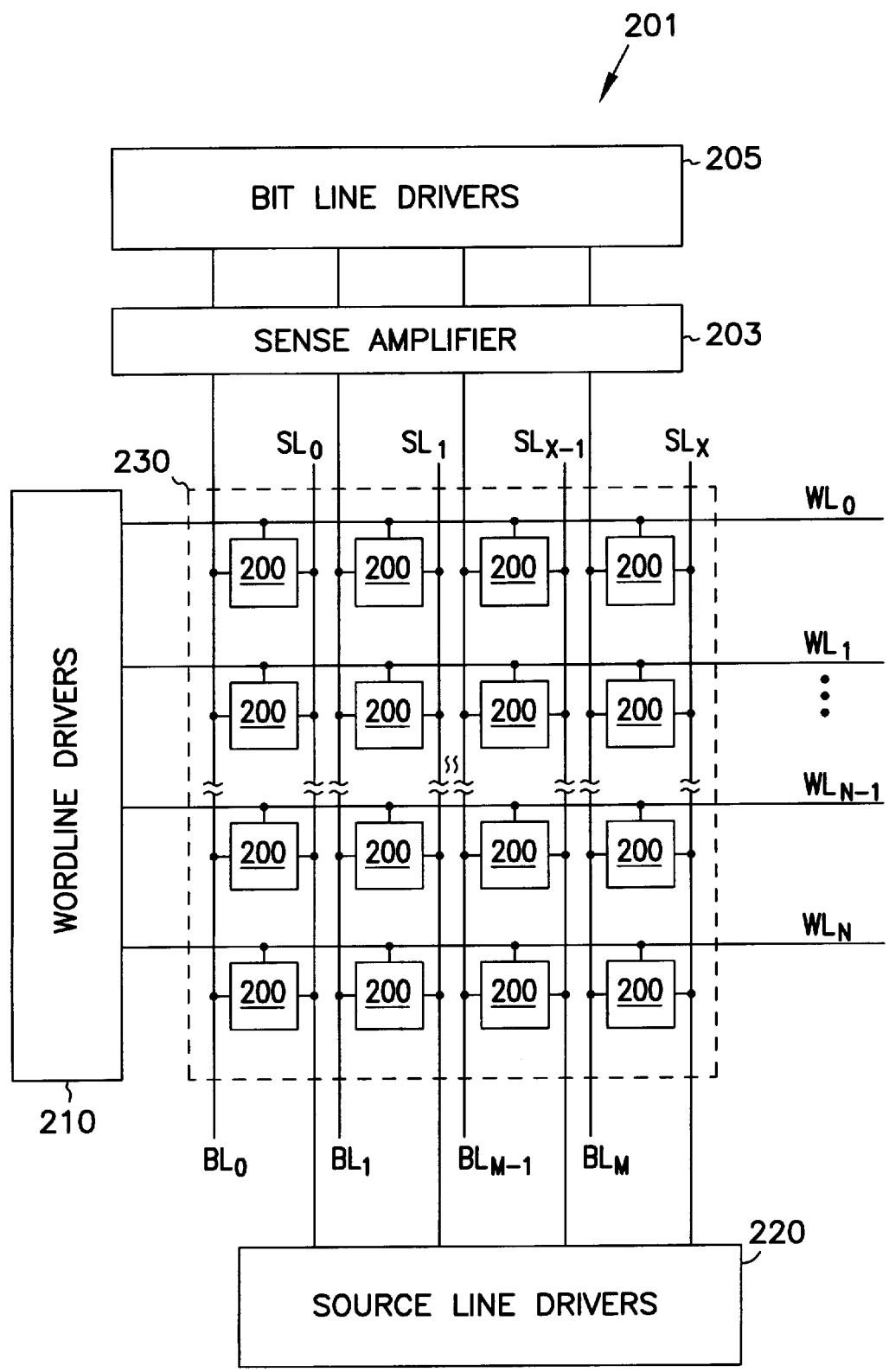
FIG. 2 is a block diagram illustrating an embodiment of a memory array according to the teachings of the present invention.

FIG. 2 is a block diagram illustrating an embodiment of a memory array 201 according to the teachings of the present invention. The memory array 201 is comprised of an array of non volatile memory cell structures 230 which includes a number of individual FLOTOX transistors 200. Each FLOTOX transistor 200 includes the non volatile memory cell structure described above in conjunction with FIGS. 1A and 1B. Array 230 includes a number of wordlines, a number of bitlines, and a number of sourcelines. In one embodiment, there are N rows wordlines $WL_0, WL_1 \ldots WL_{N-1}, WL_N$. Each of the N rows of wordlines couples the second conductive layer, or control gate, for a number of FLOTOX transistors 200 in the row. In analogous fashion, array 230 has M columns of bitlines $BL_0, BL_1, \ldots BL_{M-1}, BL_M$. Each of the M columns of bitlines couples the second source/drain region for a number of FLOTOX transistor 200 in the column. This embodiment further includes X columns of sourcelines $SL_0, SL_1, \ldots SL_{X-1}, SL_X$. Each of the X sourcelines couples the first source/drain region for a number of FLOTOX transistors 200 in the column. It should be noted the numbers represented by the variable X, M, and N may be the same or different.

The N rows wordlines $WL_0, WL_1 \ldots WL_{N-1}, WL_N$ are coupled to wordline drivers 210 and communicate with the control gates to selectively read, program, erase, or reprogram the FLOTOX transistors 200. The M columns of bitlines are coupled to a number of sense amplifiers 203 and serve to transport bits of data information to and from the number of FLOTOX transistors 200 of the memory array 201. A number of bitline drivers 205 are coupled to the number of sense amplifiers 203. The X columns of sourcelines $SL_0, SL_1, \ldots SL_{X-1}, SL_X$ are used to couple a power supply 220 ($V_{DD}$) to the number of FLOTOX transistors 200 in the memory array 201. The read, program and unprogram operations for a non volatile memory cell, of which flash memory is one form and EEPROMS are another, are well known by those of ordinary skill in the art. The actual steps in such processes do not form part of the present invention and thus are not recited in detail here.

Figure 3:
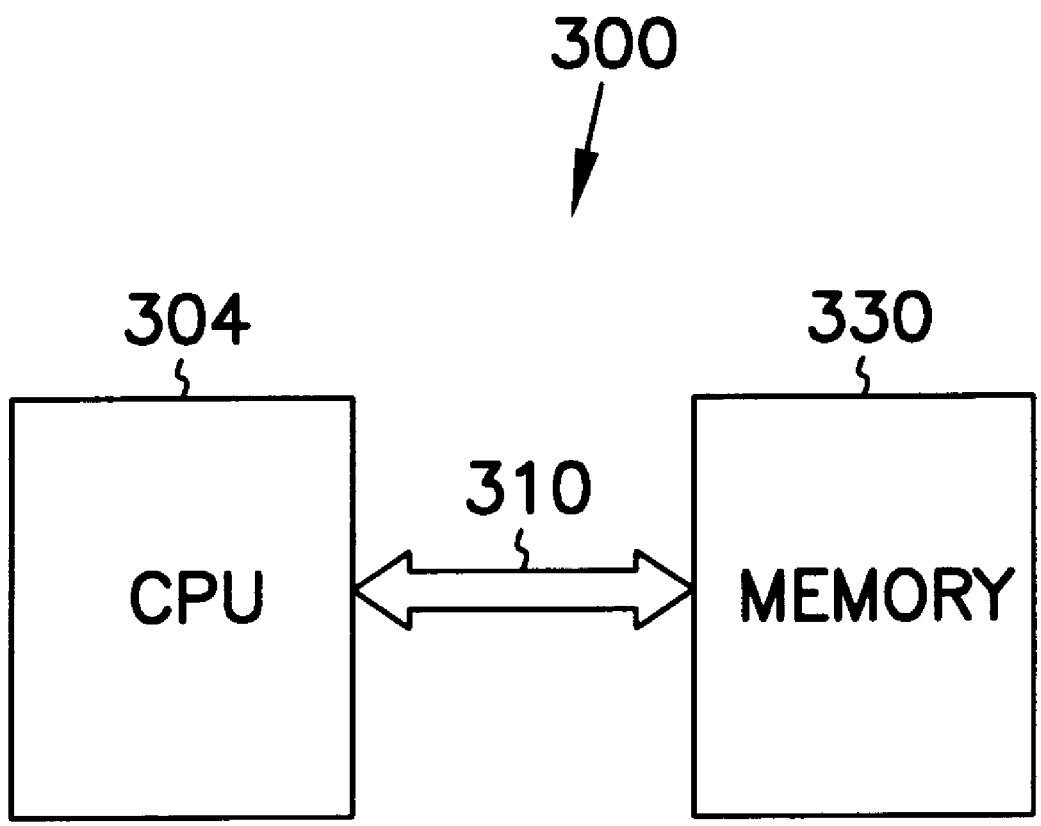
FIG. 3 is a block diagram illustrating an information handling system according to an embodiment of the present invention.

FIG. 3 is a block diagram illustrating an information handling system 300 according to an embodiment of the present invention. FIG. 3 illustrates that information handling system includes a memory 330. The memory array includes the memory array provided and described above in connection with FIG. 2. The information handling system 300 further includes a central processing unit (CPU) 304. The CPU couples to the memory 330 via a system bus 310. CPUs 304 and system buses 310 are well known to those of ordinary skill in the art. These CPUs 304 and system buses 310 are commercially available in many suitable forms for implementation with the present invention. Those skilled in the art will recognize and be able to employ such suitable devices with the present invention. As such, a detailed of these CPUs 304 and system buses 310 is not provided here.

FIGS. 4A–4D illustrate an embodiment of a process of fabrication for a non volatile floating gate tunneling oxide (FLOTOX) transistor according to the teachings of the present invention. The standard FLOTOX transistor includes a source, a drain, and a body region all formed within a substrate. The body region separates the source and drain regions. These regions are covered by a tunnel dielectric. A floating gate is located on the tunnel dielectric. Further a control gate is located on the floating gate. A second dielectric layer is interposed between and separates the control gate and the floating gate. Standard FLOTOX transistor formation, of this sort, is generally known by those of ordinary skill in the art. Therefore, for succinctness, FIGS. 4A–4D illustrate only the manner in which the substrate interface below the tunnel dielectric layer is structured without specific details as to how this region is mask defined or how other portions of the wafer are protected using standard materials and methods. The description relates to the surface structure in the body region as well as for portions of the first and second source/drain regions of the FLOTOX transistor.

Figure 4A:
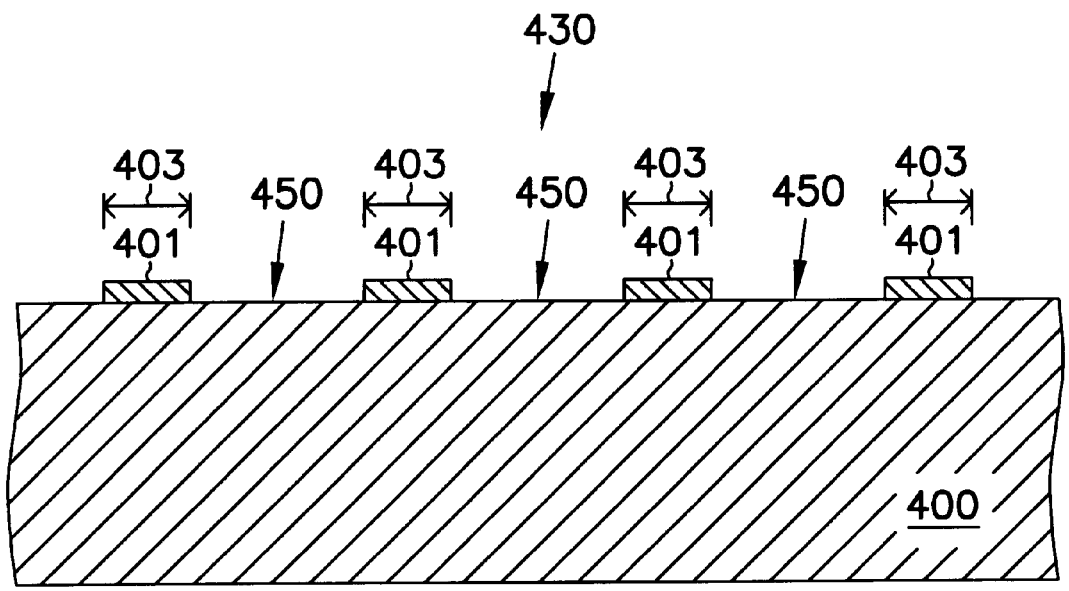
FIGS. 4A–4D illustrate an embodiment of a process of fabrication for a non volatile floating gate tunneling oxide (FLOTOX) transistor according to the teachings of the present invention.

FIG. 4A illustrates the structure after the following series of processing steps. The substrate surface 450 is cleaned using a wet etch of hydrofluoric acid (HF). In one embodiment, the substrate 400 is single crystalline silicon (Si) which has been doped with p-type dopant to form a p-type body region. In another embodiment, the substrate 400 is single crystalline silicon (Si) which has been doped with an n-type dopant to form an n-type body region. In another embodiment, the substrate 400 is single crystalline silicon (Si) which has been doped with an ntype dopant to form an n+ source/drain region. In still another embodiment, the substrate 400 is single crystalline silicon (Si) which has been doped with p-type dopant to form an p+ source/drain region.

A surface treatment 401 is applied to the surface 450 of the substrate 400. In one exemplary embodiment, the surface treatment 401 is a gold-palladium (AuPd) alloy which consist of a 6:4 combination ratio respectively. In an alternative embodiment, other suitable surface treatments 401 can be used. The AuPd surface treatment 401 is applied to the surface 450 of the substrate 400 by any suitable process such as, for example, by sputtering. The AuPd alloy is sputtered onto the surface using conventional techniques known by those of ordinary skill in the field of semiconductor fabrication. The AuPd alloy is sputtered on the substrate surface 450 to a thickness of approximately 0.4 nanometers (nm). The sputtering process results in a surface treatment of AuPd islands 401 with diameters of approximately 2 nm on 20 nm centers creating a self structured mask.

Figure 4B:
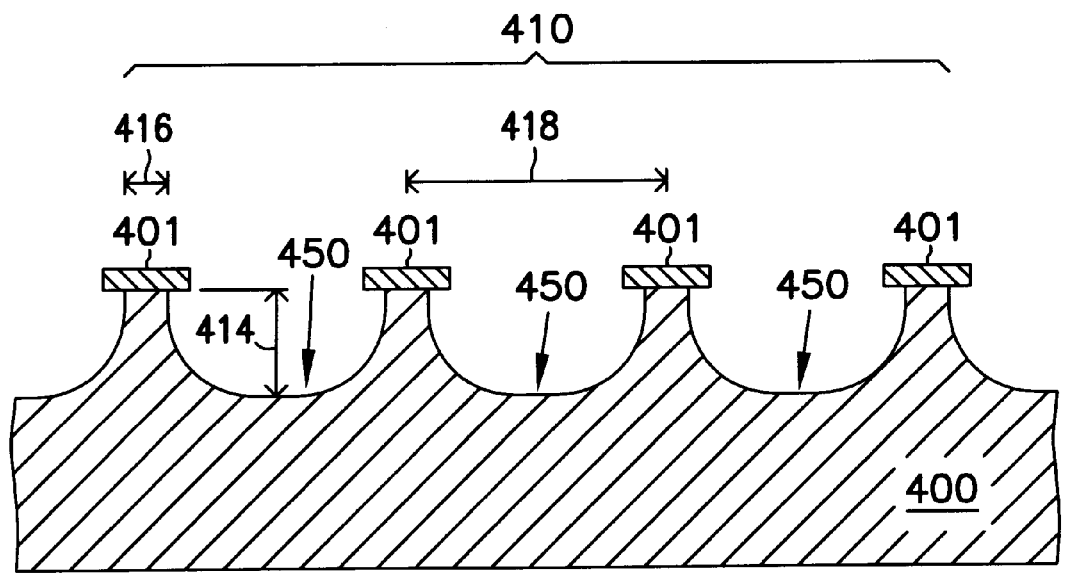
Figure 4C:
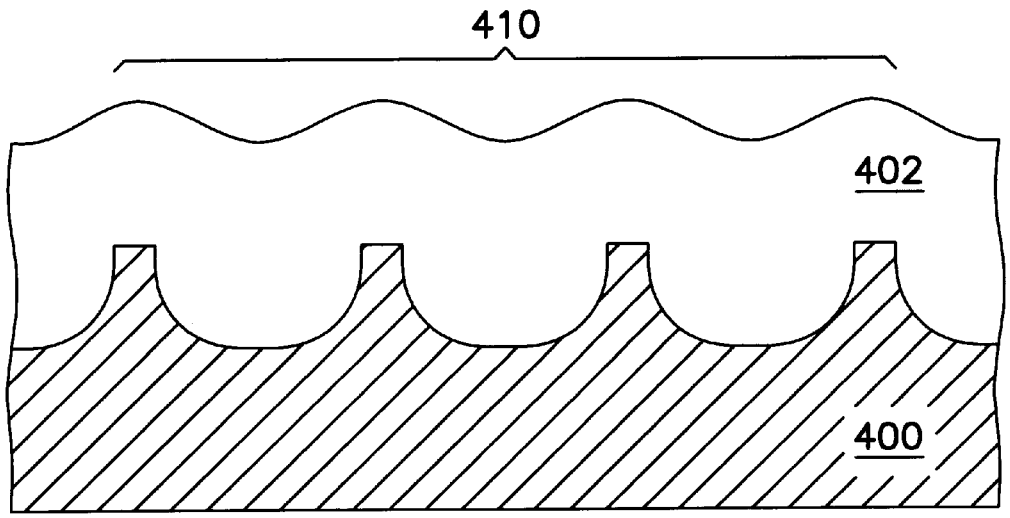
Figure 5:
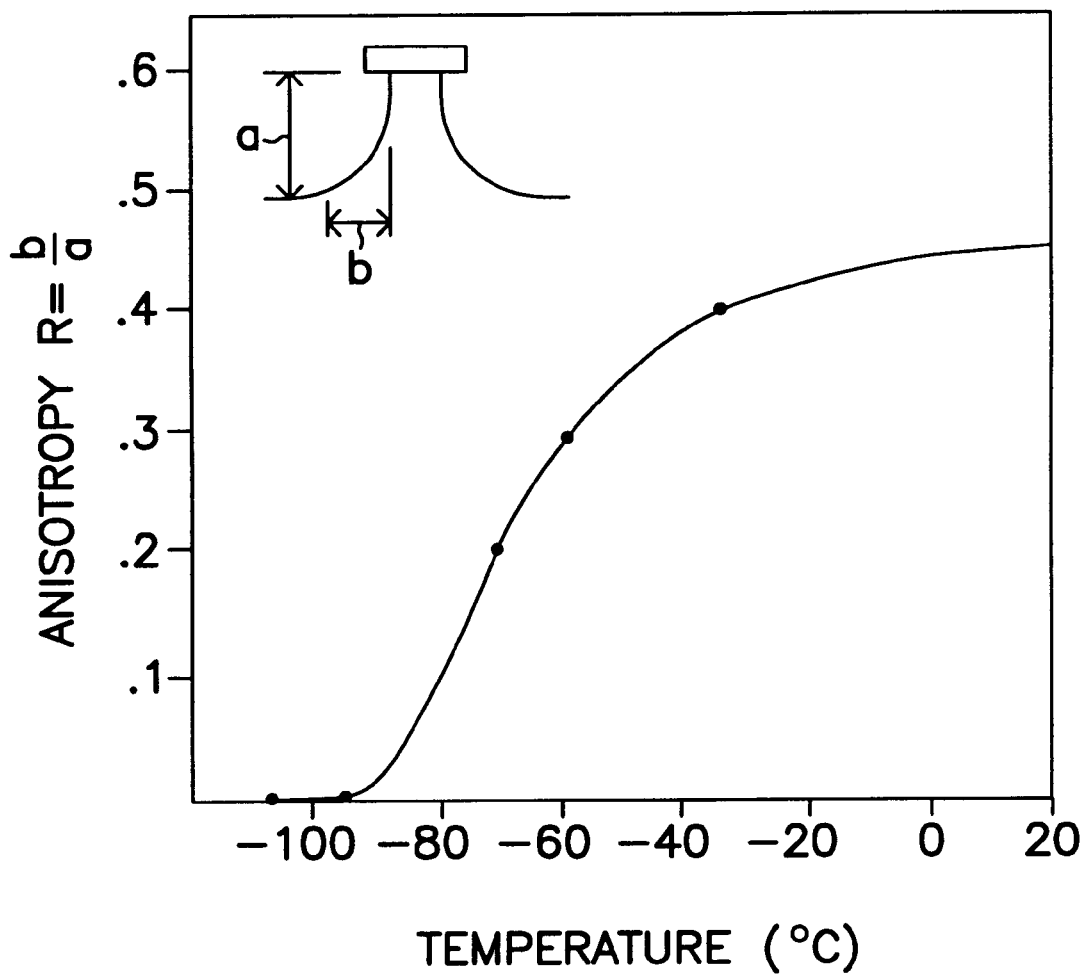
FIG. 5 is a graph illustrating the temperature dependence of anisotropy in a reactive ion etch (RIE) using a sulfur hexafluoride ($SF_6$) gas.

FIG. 4B illustrates the structure following the next series of processing steps. Next, in one embodiment, the substrate 400 is dry etched using reactive ion etching (RIE). The dry etch is performed using a sulfur hexafluoride ($SF_6$) gas. In an alternative embodiment, other compatible etching techniques can be utilized. The dry etch is performed in an rf cathode-coupled, parallel plate plasma etcher with temperature controlling electrodes which regulate the temperature of the substrate 400. Such systems can maintain the substrate 400 temperature range from −150 to +200 degrees Celsius (C). In one exemplary embodiment, the substrate temperature is maintained at −80 degrees Celsius. The rf power density in the RIE process is 0.2 Watts per cubic centimeter ($W/cm^3$) and the $SF_6$ gas pressure is kept at 8.6 Pascals 15 (Pa). This process yields an etch rate of 400 nanometers per minute (nm/min). The substrate is etched for 1 second. The etch, under these conditions produces an array of microtips 410. As illustrated in FIG. 4B, the microtips in the array of microtips 410 have an average height of 7 nm, a top surface diameter of 0.5 nm with a density of $10^{12}$ microtips per square centimeter ($10^{12}/cm^2$). In an alternative embodiment, the power density and/or $SF_6$ gas pressure can be reduced to allow for longer etch times. Similarly, other average heights and diameters for the microtips can be achieved by varying the substrate 400 temperature and etch times. FIG. 5 shows the anisotropic temperature dependence of $SF_6$ in a RIE under the conditions of the exemplary embodiment described above. FIG. 4C illustrates the structure after the next sequence of processing steps. The surface treatment 401 and the self-structure mask is removed using any suitable, conventional stripping techniques. Such stripping techniques are well know by those practiced in the art of semiconductor fabrication. Next, an oxide layer 402 is formed across the array of microtips 410. The oxide layer 402 forms a first interface in combination with the array of microtips 410. The array of microtips 410 constitute a first portion of the first interface. The oxide layer 402 is formed using any suitable technique, e.g., low pressure chemical vapor deposition (LPCVD). The oxide layer 402 serves as the tunnel oxide layer for the FLOTOX transistor. Thus, the tunnel oxide is deposited to the appropriate thickness for the type of FLOTOX desired. In example, if the FLOTOX is of the flash memory type, the oxide layer 402 will typically have a thickness of less than 150 Angstroms (Å). If, however, the FLOTOX is of the electronically erasable and programmable read only memory (EEPROM) type the oxide layer 402 will typically have a thickness of 150 Å or greater. The structure is now as is illustrated in FIG. 4C.

Figure 4D:
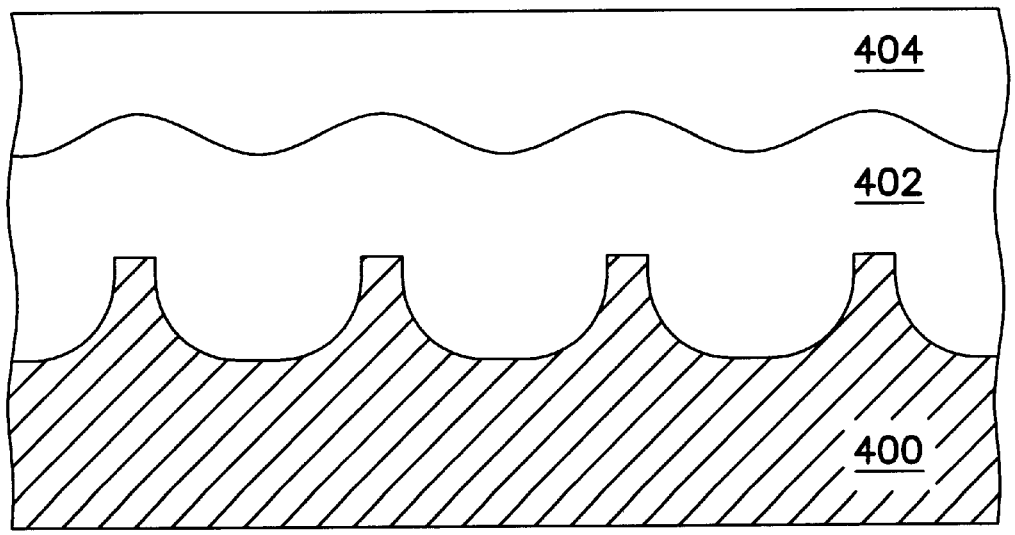

FIG. 4D illustrates the structure following the next sequence of processing steps. A first conductive layer 404 is formed on the oxide layer 402. The first conductive layer 404 is a first gate and serves as the floating gate in a FLOTOX transistor. The first conductive layer is formed using any suitable method such as, for example, chemical vapor deposition (CVD). In one embodiment, the first conductive layer 404 is polysilicon and forms a second interface in conjunction with the oxide layer 402. The structure is now as appears in FIG. 4D.

The remaining processing steps for completing the FLOTOX transistor follow conventional methods. These methods are well known by those practiced in the art of semiconductor fabrication. A second dielectric layer is formed on the floating gate and a second conductive layer, e.g., a control gate, is formed on the second dielectric layer according to such conventional methods. The second dielectric layer and the control gate form a third and fourth interface, respectively, in the FLOTOX transistor. Contact holes and wiring for wordlines, bitlines, and sourcelines are achieved through conventional processing steps. One skilled in the art will recognize the method to these steps and, hence, they are not disclosed as part of this application.

Conclusion

A method and structure for textured surfaces in floating gate tunneling oxide (FLOTOX) transistors are provided. The present invention capitalizes on using "self-structured masks" and a controlled etch to form nanometer scale microtip arrays creating a textured surface between the floating gate and the FLOTOX transistor. The microtips in the array of microtips have a more uniform size and shape and higher density (~$10^{12}$/cm$^2$) at the substrate/tunnel oxide (Si/SiO$_2$) interface than achieved in present FLOTOX technology. This higher density is four orders of magnitude greater than that which had been previously achieved. In result, the new method and structure produce significantly larger tunneling currents for a given voltage than attained in prior work. The tunneling currents and voltage levels make these new FLOTOX transistors suitable for replacing the high density, low operation transistors found in DRAMs.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A method for fabricating a non volatile memory cell structure, comprising:

forming a textured surface on a substrate, forming the textured surface includes forming an array of microtips, each microtip having a top surface, forming the array of microtips includes forming the microtips to have an average density of $10^2$/cm$^2$, wherein forming each microtip in the array of microtips includes forming each microtip to have an average height of 7 nanometers (nm), forming each microtip to have an average diameter at the top surface of 0.5 nm, and forming the microtips to have a center to center spacing of 20 nm;

forming a first gate on the tunnel oxide layer;

forming an insulator layer on the first gate; and forming a second gate on the insulator layer.

2. The method of claim 1, wherein forming the first gate comprises forming a layer of polysilicon.

3. The method of claim 1, wherein forming the second gate comprises forming a layer of polysilicon.

4. The method of claim 1, wherein forming each microtip in the array of microtips includes forming each microtip to have an average height of 7 nanometers (nm), forming each microtip to have an average diameter at the top surface of 0.5 nm, and forming the microtips to have an average center to center spacing of 20 nm.

5. The method of claim 1, the method further comprising:

forming a first source/drain region in a first portion of a body region of the substrate;

forming a second source/drain region in a second portion of the body region of the substrate; and forming a channel in the body region in the substrate wherein the channel region connects the first source/drain region to the second source/drain region.

6. A method for fabricating a transistor, comprising:

forming a first interface, forming the first interface includes forming spaced source and drain regions and a body region therebetween on a first portion of the first interface, and includes forming a micro-roughened surface on the first portion of the first interface in an array of asperities, each asperity having a top surface, and includes forming the asperities with an average density of $10^{12}$/cm$^2$, wherein forming each asperity in the array of asperities includes forming each asperity to have an average height of 7 nanometers (nm), forming each asperity to have an average diameter at the top surface of 0.5 nm, and forming the asperities to have a center to center spacing of 20 mn;

forming a second interface on the first interface;

forming a third interface on the second interface; and forming a fourth interface on the third interface.

7. The method of claim 6, wherein forming the first interface comprises:

forming a self-structured mask on the first portion of the first interface;

etching the first portion of the first interface to form the array of asperities;

removing the self-structured mask; and depositing a tunnel oxide layer on the first portion of the first interface.

8. The method of claim 7, wherein forming the self-structured mask comprises sputtering an alloy onto the first portion of the first interface, and wherein etching the first portion of the first interface includes performing a dry etch in the presence of a sulfur hexafluoride ($SF_6$) gas.

9. The method of claim 7, wherein etching the first portion of the first interface includes controlling the temperature of the substrate.

10. The method of claim 6, wherein forming the second interface comprises depositing a polysilicon layer on the tunnel oxide layer of the first interface.

11. The method of claim 6, wherein forming the third interface comprises depositing an insulator layer on the polysilicon layer of the second interface.

12. The method of claim 6, wherein forming the fourth interface comprises depositing a polysilicon layer on the insulator layer of the third interface.

13. A method for fabricating a non volatile memory cell structure, comprising:

forming a textured surface on a substrate, forming the textured surface includes forming an array of microtips, each microtip having a top surface, forming the array of microtips includes forming the microtips to have an average density of $10^{12}/cm^2$, wherein forming each microtip in the array of microtips includes forming each microtip to have an average height of 7 nanometers (nm), forming each microtip to have an average diameter at the top surface of 0.5 nm, and forming the microtips to have a center to center spacing of 20 nm, and wherein forming the array of microtips on the substrate includes;

forming a self-structured mask on the substrate;

etching the substrate using the self structured mask to form the array of asperities; and removing the self-structured mask; and forming a tunnel oxide layer on the array of asperities;

forming a first gate on the tunnel oxide layer;

forming an insulator layer on the first gate; and forming a second gate on the insulator layer.

14. The method of claim 13, wherein forming the self-structured mask comprises uniformly sputtering an alloy onto the substrate, wherein uniformly sputtering the alloy onto the substrate includes uniformly sputtering the alloy onto the substrate to a thickness of 0.4 nanometers (nm) which results in a surface treatment of a number of alloy islands having a diameter of 2.0 nm on 20 nm centers creating the self structured mask.

15. The method of claim 13, wherein the substrate includes single crystalline silicon.

16. The method of claim 13, wherein etching the substrate includes performing a dry etch in the presence of a sulfur hexafluoride ($SF_6$) gas.

17. The method of claim 16, wherein performing a dry etch in the presence of a sulfur hexafluoride ($SF_6$) gas includes simultaneously controlling the temperature of the substrate to a negative (−) 80 degrees Celsius.

18. A method for fabricating a non volatile memory cell structure, comprising:

forming a textured surface on a single crystalline substrate, forming the textured surface includes forming an array of microtips, each microtip having a top surface, forming the array of microtips includes forming the microtips to have an average density of $10^{12}/cm^2$, forming each microtip to have an average diameter at the top surface of 0.5 nm, and forming the microtips to have a center to center spacing of 20 nm, and wherein forming the array of microtips on the substrate includes;

forming a self-structured mask on the single crystalline substrate by uniformly sputtering an alloy onto the substrate, wherein uniformly sputtering the alloy onto the substrate includes uniformly sputtering the alloy onto the substrate to a thickness of 0.4 nanometers (nm) which results in a surface treatment of a number of uniform alloy islands having a diameter of 2.0 nm on 20 nm centers creating the self structured mask;

etching the substrate using the self structured mask to form the array of asperities, wherein etching the substrate includes performing a dry etch in the presence of a sulfur hexafluoride ($SF_6$) gas and includes simultaneously controlling the temperature of the substrate to a negative 80 degrees Celsius; and removing the self-structured mask; and forming a tunnel oxide layer on the array of asperities;

forming a first gate on the tunnel oxide layer;

forming an insulator layer on the first gate; and forming a second gate on the insulator layer.

19. The method of claim 18, wherein etching the substrate includes using a reactive ion etch process with an rf power density of 0.2 Watts per cubic centimeter ($W/Cm^3$) and wherein the $SF_6$ gas pressure is maintained at 8.6 Pascals (Pa).

20. The method of claim 14, wherein the etching the substrate includes etching the substrate for 1.0 second.

21. The method according to claim 1, wherein forming the microtips to have a center to center spacing of 20 nm includes forming the microtips to have an average center to center spacing of 20 nm.

* * * * *

UNITED STATES PATENT AND TRADEMARK OFFICE
CERTIFICATE OF CORRECTION

PATENT NO. : 6,242,304 B1
DATED : July 23, 2001
INVENTOR(S) : Joseph E. Geusic, Leonard Forbes It is certified that error appears in the above-identified patent and that said Letters Patent is hereby corrected as shown below:

Title page, Item [54], and Column 1, lines 1-3,
"METHOD AND STRUCTURE FOR TEXTURED SURFACES IN FLOATING GATE TUNNELING OXIDE DEVICES" should read -- METHOD FOR TEXTURED SURFACES IN FLOATING GATE TUNNELING OXIDE DEVICES --.

Column 3,
Line 63, "$10^2/cm^2$" should read -- $10^{12}/cm^2$ --.

Column 5,
Line 64, "an p-type" should read -- a p-type --.

Column 6,
Line 10, delete "a" between "form" and "p+type".

Column 7,
Line 53, "detailed" should read -- detail --.

Column 8,
Line 18, "ntype" should read -- n-type --.
Line 26, "consist" should read -- consists --.
Lines 52-53, delete "15" between "Pascals" and "(Pa)".

UNITED STATES PATENT AND TRADEMARK OFFICE
CERTIFICATE OF CORRECTION

PATENT NO. : 6,242,304 B1
DATED : July 23, 2001
INVENTOR(S) : Joseph E. Geusic, Leonard Forbes It is certified that error appears in the above-identified patent and that said Letters Patent is hereby corrected as shown below:

Column 10, claim 1,
Lines 18-19, insert -- forming a tunnel oxide layer on the textured surface; -- between "20nm;" and "forming a first gate".

Signed and Sealed this

Nineteenth Day of February, 2002

JAMES E. ROGAN
Director of the United States Patent and Trademark Office